(12) United States Patent
Nakai et al.

(10) Patent No.: US 7,286,407 B2
(45) Date of Patent: Oct. 23, 2007

(54) SEMICONDUCTOR DEVICE AND METHOD FOR CONTROLLING THE SAME

(75) Inventors: Tsutomu Nakai, Saitama (JP); Kazuhide Kurosaki, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/261,743

(22) Filed: Oct. 28, 2005

(65) Prior Publication Data

US 2006/0092706 A1    May 4, 2006

Related U.S. Application Data

(63) Continuation of application No. PCT/JP04/16118, filed on Oct. 29, 2004.

(51) Int. Cl.
*G11C 16/04* (2006.01)
(52) U.S. Cl. .................... 365/185.18; 365/185.21; 365/185.25; 365/185.28
(58) Field of Classification Search ........... 365/185.18, 365/185.21, 185.25, 185.28
See application file for complete search history.

(56) References Cited

U.S. PATENT DOCUMENTS 5,422,842 A    6/1995    Cernea et al. ............. 365/185
5,566,111 A    10/1996   Choi ........................ 365/185
5,721,704 A *  2/1998    Morton .................. 365/185.23
5,757,700 A    5/1998    Kobayashi ................ 365/189
6,104,637 A *  8/2000    Seo ....................... 365/185.24

FOREIGN PATENT DOCUMENTS

| JP | 09-91980    | 4/1997  |
| JP | 9-293387    | 11/1997 |
| JP | 11126487    | 5/1999  |
| JP | 2001015716  | 1/2001  |
| JP | 2003199329  | 7/2003  |
| JP | 2003223793  | 8/2003  |

* cited by examiner

*Primary Examiner*—Hoai V. Ho

(57) ABSTRACT

A semiconductor device includes a program voltage supply circuit that supplies a drain of a memory cell with a program voltage, and a pull-down circuit that pulls down a potential of an output of the program voltage supply circuit in accordance with a current that flows in a data bus line connected to the memory cell. The semiconductor device may include a program voltage restrain circuit that restrains an intensity of supply of the program voltage by the program voltage supply circuit.

10 Claims, 11 Drawing Sheets

Fig. 6
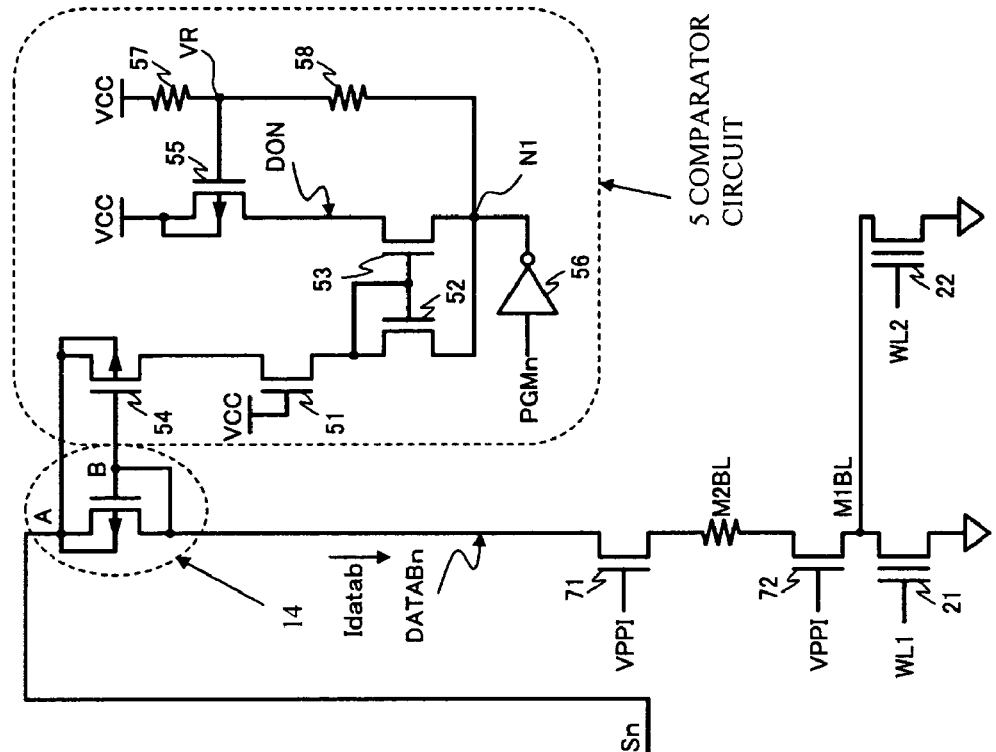
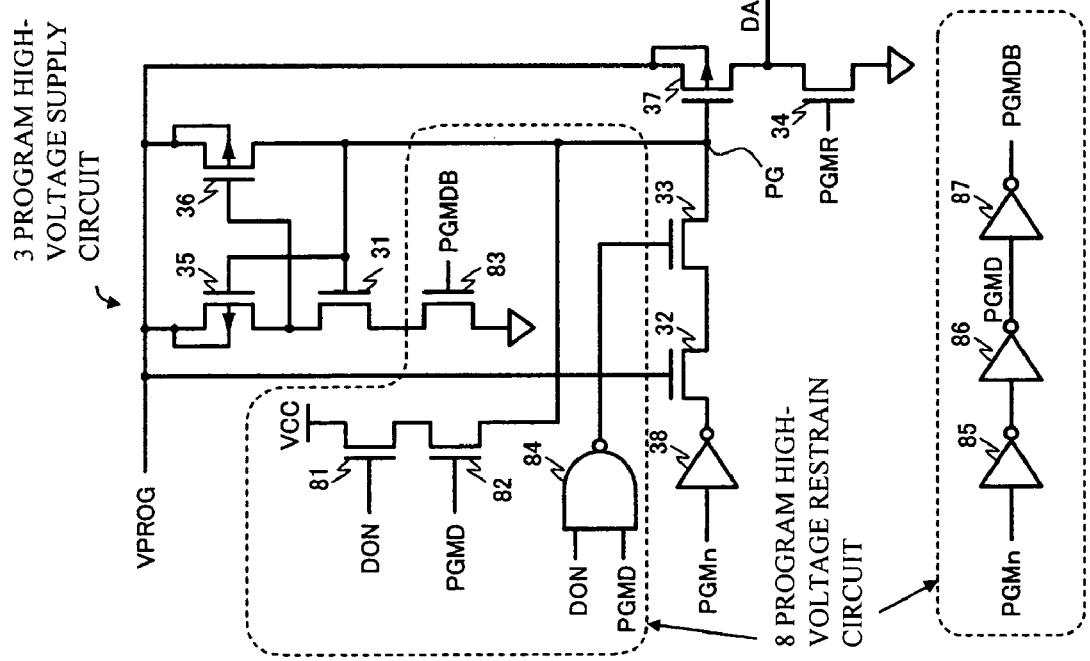

us 7,286,407 B2

SEMICONDUCTOR DEVICE AND METHOD FOR CONTROLLING THE SAME

CROSS REFERENCE TO RELATED APPLICATIONS

This is a continuation of International Application No. PCT/JP2004/016118, filed Oct. 29, 2004.

BACKGROUND OF THE INVENTION

1. Field of the Invention

The present invention relates to a semiconductor device and a method for controlling the semiconductor device. More particularly, the present invention relates to a semiconductor device capable of controlling the drain voltage in programming and a method for controlling the semiconductor device.

2. Description of the Related Art

FIG. 1 is a circuit diagram of a circuit involved in programming of a conventional non-volatile semiconductor memory device. A non-volatile semiconductor memory device 1 includes memory cells 21 and 22 and a program high-voltage supply circuit 3. The memory cells 21 and 22 are flash memory cells having a floating gate or a nitride film as a charge storage layer. In programming, a high voltage is applied to the selected cell, and a hot carrier is injected in the charge storage layer. A high voltage VPROG for programming used in the non-volatile semiconductor memory device 1 is generated by regulating a high voltage generated by a not-shown high-voltage generating circuit at a given constant level. The high programming voltage VPROG is applied to a common data bus line DATABn coupled to the bit lines via the program high-voltage supply circuit 3. The drain voltage of the cell to be programmed is supplied via the common data bus line DATABn where n indicates the width of the data bus line and ranges from, for example 0 to 15.

Generally, the voltage really applied to the drain of the memory cell to be programmed varies based on the state of the memory cell. More particularly, when the memory cell in the erased state is to be programmed, the gate of the memory cell is selected, so that the drain and source of the memory cell can conduct. The high programming voltage on the common data bus line is regulated at the given constant level, nevertheless the programming voltage drops at a position close to the memory cell. When the programming of the selected memory cell progresses, the threshold value of the cell is raised. Thus, even when the gate is in the selected state, the conduction between the drain and the source is weakened, and the voltage of the common data bus line is applied to the drain of the memory cell without dropping.

U.S. Pat. No. 5,422,842 discloses a device in which the programming current is compared with the reference current, and programming is terminated when the verification of programming passes.

Japanese Patent Application Publication 2001-15716 discloses a device that uses a constant-current element that limits the current applied to the drain of the memory cell to a given level.

The drain voltage for programming is required to be higher due to an increase in a drain resistance R of the memory cell caused by miniaturization in order to improve the capacity and rewriting speed of the non-volatile semiconductor memory device.

However, a drain disturb is likely to occur on the unselected memory cell 22 that shares the drain with the selected memory cell 21 because less current flows through the memory cell involved in programming at the end of programming or just prior to completion of programming and the drain voltage is thus raised. That is, as shown in FIG. 2, at the time of programming, when a signal PGMn becomes HIGH, the output of the high programming voltage drops due to the resistance because the cell is in the erased state. This causes a voltage slightly lower than the potential of the common data bus line DATABn to be applied to a metal bit line M1BL. Then, less current flows through the memory cell 21 as the programming progresses, and the voltage of the metal bit line M1BL reaches the level of the common data bus line DATABn. When the voltage of the metal bit line M1BL is high, a drain disturb may occur on the unselected memory cell 22 that shares the drain with the selected memory cell 21.

The proposal disclosed in U.S. Pat. No. 5,422,842 does not solve the above problem. The proposal in Japanese Patent Application Publication 2001-15716 does not solve the above problem.

SUMMARY OF THE INVENTION

The present invention has been made taking the above into consideration and has an object of providing a semiconductor device and a method for controlling the same capable of reducing a drain disturb applied to a memory cell that shares the drain with the selected memory cell for programming at the end of programming or just prior to completion thereof.

This object of the present invention is achieved by a semiconductor device comprising: a program voltage supply circuit that supplies a drain of a memory cell with a program voltage; and a pull-down circuit that pulls down a potential of an output of the program voltage supply circuit in accordance with a current that flows in a data bus line connected to the memory cell. With this structure, when current flowing through a drain node in programming becomes lower than a given constant level, the drain voltage is controlled to be lower than the level in normal programming. It is thus possible to suppress the drain voltage when the programming is completed or is about to be completed and to prevent an unselected memory cell that shares the drain with the selected memory cell from receiving a drain disturb.

The semiconductor device may further include a program voltage restrain circuit that restrains an intensity of supply of the program voltage by the program voltage supply circuit. With this structure, it is possible to prevent the drain voltage from being raised when the programming is about to be completed.

The present invention also includes a semiconductor device comprising: a program voltage supply circuit that supplies a drain of a memory cell with a program voltage; and a program voltage restrain circuit that restrains an intensity of supply of the program voltage by the program voltage supply circuit in accordance with a current that flows in a data bus line connected to the memory cell. With this structure, when current flowing through a drain node in programming becomes lower than a given constant level, the intensity (ability) of supplying the program voltage of the program voltage supply circuit is restrained to control the drain voltage to be lower than the level in normal programming. It is thus possible to suppress the drain voltage when the programming is completed or is about to be completed and to prevent an unselected memory cell that shares the drain with the selected memory cell from receiving a drain disturb.

The semiconductor device may further include: a resistive element interposed between the output of the program voltage supply circuit and the data bus line; and a comparator circuit that determines that a potential difference across the resistive element becomes lower than a reference voltage. The resistive element is provided between the output of the program voltage supply circuit that is a drain power source for programming and the data bus line (global bit line). The comparator is provided for detecting a situation such that the difference between the ends of the resistive element becomes lower than the reference voltage. By utilizing an event in which the current flowing through the selected memory cell decreases as the programming thereof progresses, the current flowing through the drain node can be sensed and it is thus possible to sense a situation in which the programming is about to be completed.

The semiconductor device may be configured so that the program voltage supply circuit comprises a transistor that outputs the program voltage.

The semiconductor device may further includes: a resistive element interposed between the output of the program voltage supply circuit and the data bus line; and a comparator circuit that determines that a potential difference across the resistive element becomes lower than a reference voltage, the pull-down circuit being controlled by an output signal (DON) of the comparator circuit. With this structure, when the programming of the selected memory cell is about to be completed and the drain current is thus reduced, the potential of the output of the program voltage supply circuit is pulled towards the ground. It is thus possible to suppress an increase in the drain voltage when the programming is about to be completed.

The semiconductor device may further include: a resistive element interposed between the output of the program voltage supply circuit and the data bus line; and a comparator circuit that determines that a potential difference across the resistive element becomes lower than a reference voltage, the program voltage restrain circuit being controlled by an output signal (DON) of the comparator circuit.

The semiconductor device may be configured so that the transistor of the program voltage supply circuit has a gate (PG) controlled by an output signal (DON) of the comparator circuit. The resistive element may be formed by a transistor or of polysilicon.

The pull-down circuit may include a transistor connected between the output of the program voltage supply circuit and ground. The transistor size may be designed so as to flow the cell current as large as the current that flows at the commencement of programming. This makes it possible to stabilize the program voltage regardless of the state of each bit.

The semiconductor device may further include a plurality of program voltage supply circuits each of which supplies a drain of an associated memory cell with a respective program voltage, the resistive element and the comparator circuit are provided for each of the program voltage supply circuits. With this structure, it is possible to determine whether the programming is about to be completed. The memory cell may be a non-volatile memory cell equipped with a charge storage layer.

The present invention also includes a method of controlling a semiconductor device including: comparing a potential difference between an output of a program voltage supply circuit and a potential of a data bus line connected to a memory cell with a reference voltage; and pulling down a potential of the output of the program voltage supply circuit when the potential difference is lower than the reference voltage. With this structure, when current flowing through a drain node in programming becomes lower than a given constant level, the drain voltage is controlled to be lower than the level in normal programming. It is thus possible to suppress the drain voltage when the programming is completed or is about to be completed and to prevent an unselected memory cell that shares the drain with the selected memory cell from receiving a drain disturb.

The present invention also includes a method of controlling a semiconductor device comprising: comparing a potential difference between an output of a program voltage supply circuit and a potential of a data bus line connected to a memory cell with a reference voltage; and restraining an intensity of supply of a program voltage output by the program voltage supply circuit when the potential difference is smaller than the reference voltage. With this structure, when current flowing through a drain node in programming becomes lower than a given constant level, the intensity (ability) of supplying the program voltage of the program voltage supply circuit is restrained to control the drain voltage to be lower than the level in normal programming. It is thus possible to suppress the drain voltage when the programming is completed or is about to be completed and to prevent an unselected memory cell that shares the drain with the selected memory cell from receiving a drain disturb.

According to the present invention, it is thus possible to suppress the drain voltage when the programming is completed or is about to be completed and to prevent an unselected memory cell that shares the drain with the selected memory cell from receiving a drain disturb.

BRIEF DESCRIPTION OF THE DRAWINGS

FIG. 6 is a circuit diagram of the detailed configuration of the circuit involved in programming of the non-volatile semiconductor memory device according to the second embodiment of the present invention;

DESCRIPTION OF THE PREFERRED EMBODIMENTS

A description will now be given of embodiments of the present invention.

First Embodiment

Figure 1:
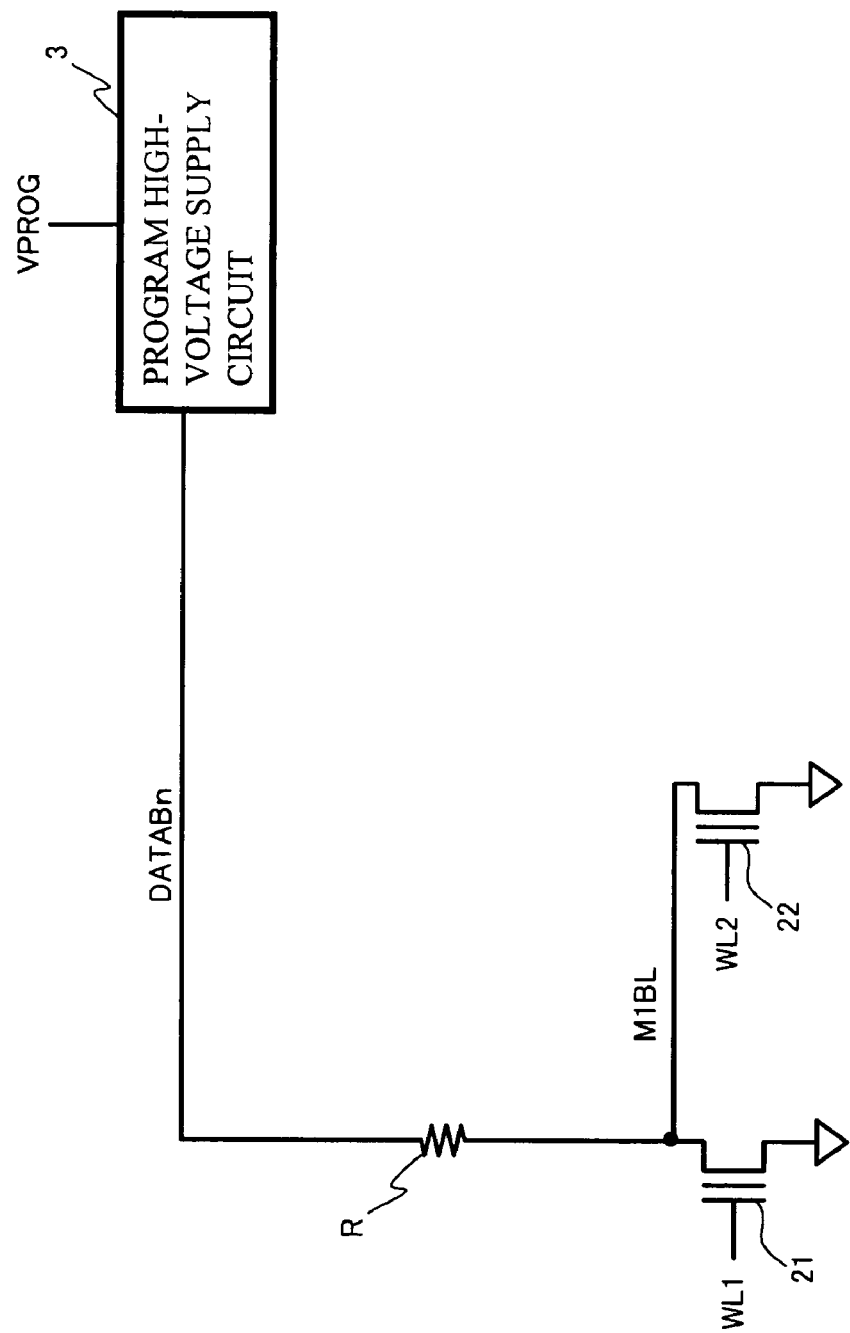
FIG. 1 is a circuit diagram of a circuit involved in programming of a conventional non-volatile semiconductor memory device.
Figure 2:
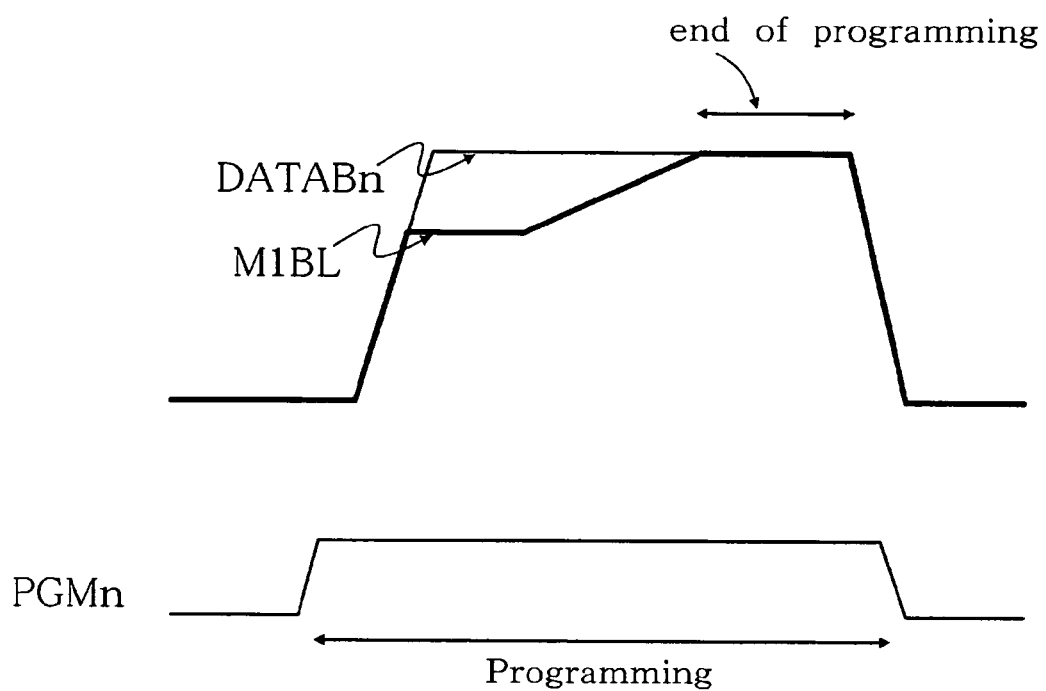
FIG. 2 is a diagram showing a drain voltage used in the conventional non-volatile semiconductor memory device.
Figure 3:
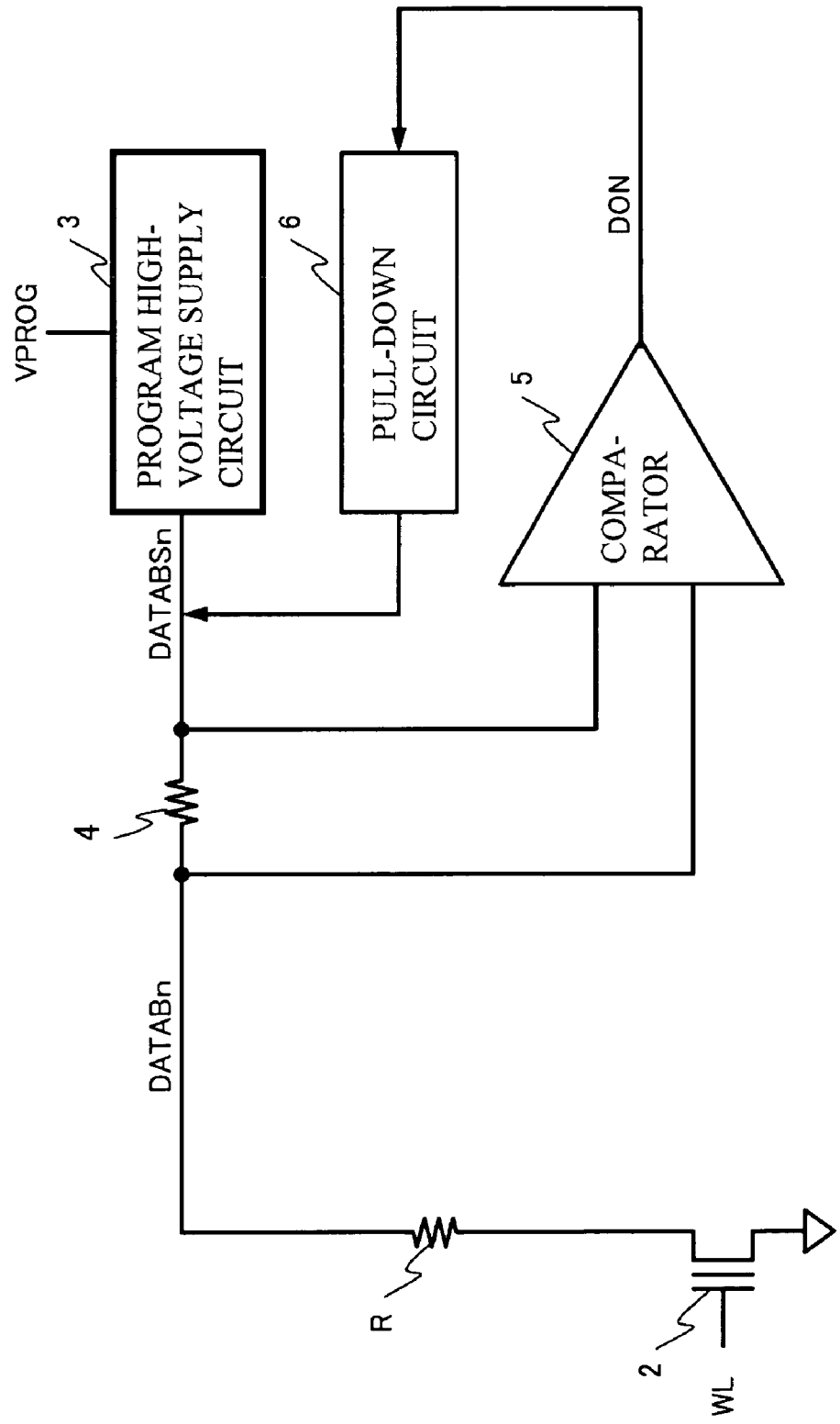
FIG. 3 is a circuit diagram of a circuit involved in programming of a non-volatile semiconductor memory device according to a first embodiment of the present invention.

FIG. 3 is a circuit diagram of a circuit involved in programming of a non-volatile semiconductor memory device according to a first embodiment of the present invention. Referring to FIG. 3, a non-volatile semiconductor memory device 10 includes a memory cell 2, a program high-voltage supply circuit 3, a resistive element 4, a comparator circuit 5 and a pull-down circuit 6. The memory cell 2 is a non-volatile memory cell having a charge storage layer. The program high-voltage supply circuit 3 supplies the drain of the memory cell 2 with a program voltage. The resistive element 4 is interposed between an output DATABSn of the program high-voltage supply circuit 3 and a common data bus line DATABn, and senses a current flowing through the resistive element 4 by the voltage drop developing across it.

The comparator circuit 5 compares the voltage drop across the resistive element 4 with a reference voltage, and switches a signal DON to HIGH when the voltage across the resistive element 4 is smaller than a given constant voltage. The current flowing through the resistive element 4 decreases as the programming progresses. It is thus determined whether the programming is about to be completed by sensing the current flowing through the resistive element 4. The pull-down circuit 6 pulls the potential of the output DATABSn of the program high-voltage supply circuit 3 towards the ground when the programming is about to be completed.

Figure 4:
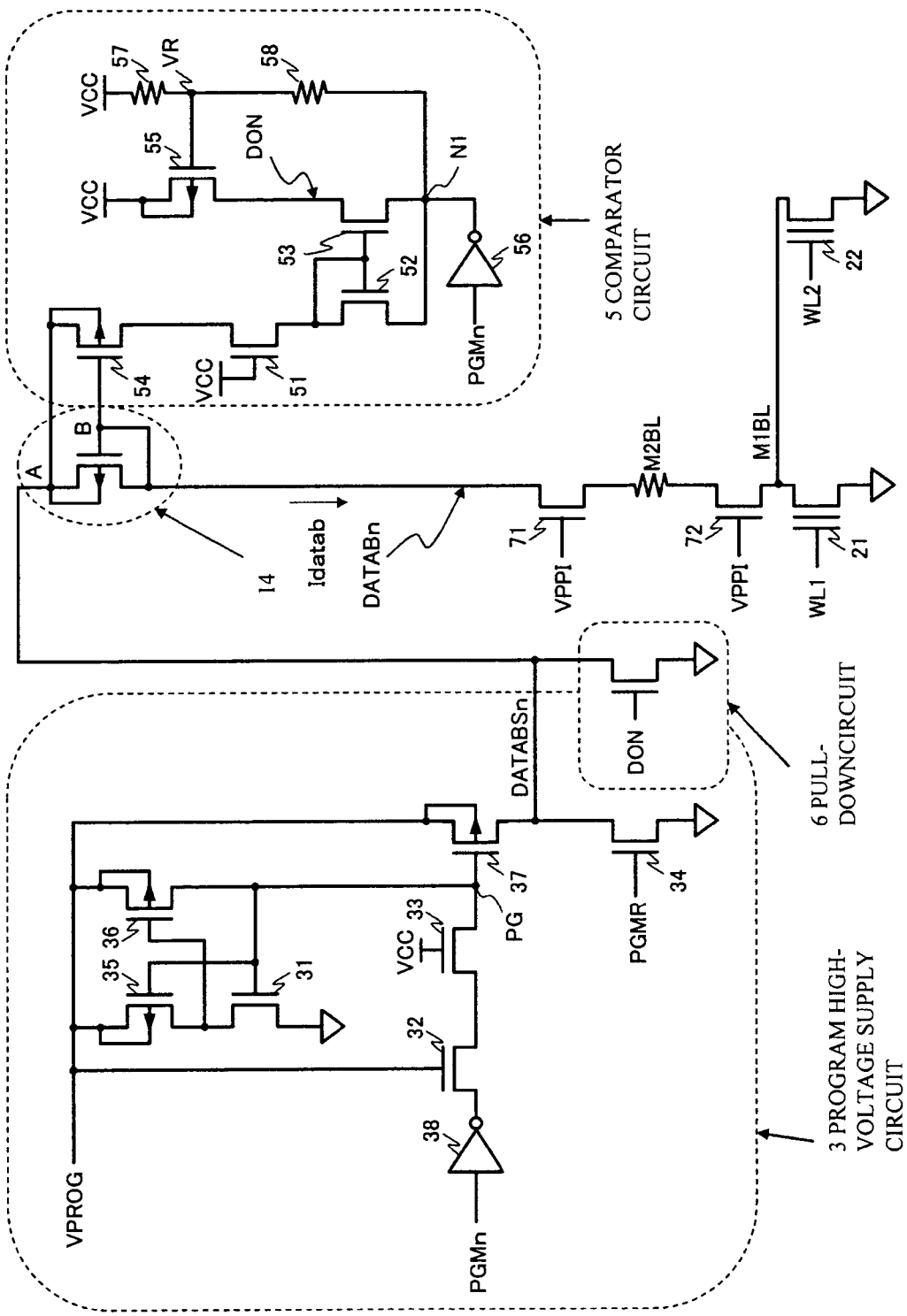
FIG. 4 is a circuit diagram of the detailed configuration of the circuit involved in programming of the non-volatile semiconductor memory device according to the first embodiment of the present invention.

FIG. 4 shows the detailed configuration of the circuit involved in programming of the non-volatile semiconductor memory device 10 according to the first embodiment of the present invention. Referring to FIG. 4, there is illustrated the non-volatile semiconductor memory device that includes memory cells 21 and 22 in addition to the above-mentioned program high-voltage supply circuit 3, the resistive element 4, the comparator circuit 5 and the pull-down circuit 6. The gates of the memory cells 21 and 22 are controlled by voltages applied to word lines WL1 and WL2, respectively. It is now assumed that the memory cell 21 is to be programmed and the memory 22 is in the unselected state. Path transistors 71 and 72 are used to select the bit line. The program high-voltage supply circuit 3 includes NMOS transistors 31 through 34, PMOS transistors 35 through 37, and an inverter 38.

The resistive element 4 is implemented by a PMOS transistor 14 provided between the output DATABSn of the program high-voltage supply circuit 3 and the common data bus line DATABn. The gate and drain of the PMOS transistor 14 are connected. That is, the resistive element 4 is formed by the diode-connected PMOS transistor 14.

The comparator circuit 5 includes NMOS transistors 51 through 53, PMOS transistors 54 and 55, an inverter 56, and resistors 57 and 58. The voltages of nodes A and B of the resistive element 4 are applied to the comparator circuit 5. The input of the comparator circuit 5 and the PMOS transistor 14 of the resistive element 4 form a current-mirror structure. The input transistor 54 of the comparator circuit 5 may have a size smaller than the PMOS transistor 14 of the resistive element 4. In the comparator circuit 5, a node N1 to which the output of the inverter 56 is connected becomes equal to the ground potential when the signal PGMn switches to HIGH at the time of programming the cell connected to the common data line DATABn.

At a node VR, the reference potential is generated by a series of resistances between a power supply voltage VCC and ground. The source of the PMOS transistor 55 is connected to the power supply voltage VCC, and the gate thereof is controlled by the node VR so that a constant current flows through the PMOS transistor 55. The voltage difference between the ends of the resistive element 4 becomes smaller than the difference between the power supply voltage VCC and the reference potential VR, the signal DON becomes HIGH. That is, the output signal DON of the comparator circuit 5 becomes HIGH when (DATABSn−DATABn).<(VCC−VR).

The program high-voltage supply circuit 3 will now be described. A signal PGMR is used for discharging and is normally LOW. At the time of programming, the signal PGMn switches to HIGH, and the high voltage VPROG for programming is supplied, without any modification, to the output DATABSn of the program high-voltage supply circuit 3 from the PMOS transistor 37. A level shifter comprises the NMOS transistor 31, the PMOS transistors 35 and 36.

The pull-down circuit 6 is formed by an NMOS transistor. The pull-down circuit 6 is controlled by the output signal DON of the comparator circuit 5, and draws the potential of the output DATABSn of the program high-voltage supply circuit 3 towards the ground. When the programming of the memory cell 21 is about to be completed, the reduced drain current flows, and the condition (DATABSn−DATABn)<(VCC−VR) stands. This switches the output signal DON to HIGH, and the NMOS transistor of the pull-down circuit 6 is turned ON so that the drain voltage can be prevented from being raised. It is thus possible to prevent a drain disturb from occurring on the unselected memory cell 22. It is to be noted that current is consumed because the NMOS transistor is in the ON state.

According to the present invention, the drain voltage is controlled to be lower than that used in the normal programming when the current flowing through the drain node in programming becomes smaller than the given constant level. It is thus possible to restrain the drain current when the programming is completed or is about to be completed and to prevent the drain disturb from occurring on the unselected memory cell that shares the drain with the selected memory cell.

Second Embodiment

Figure 5:
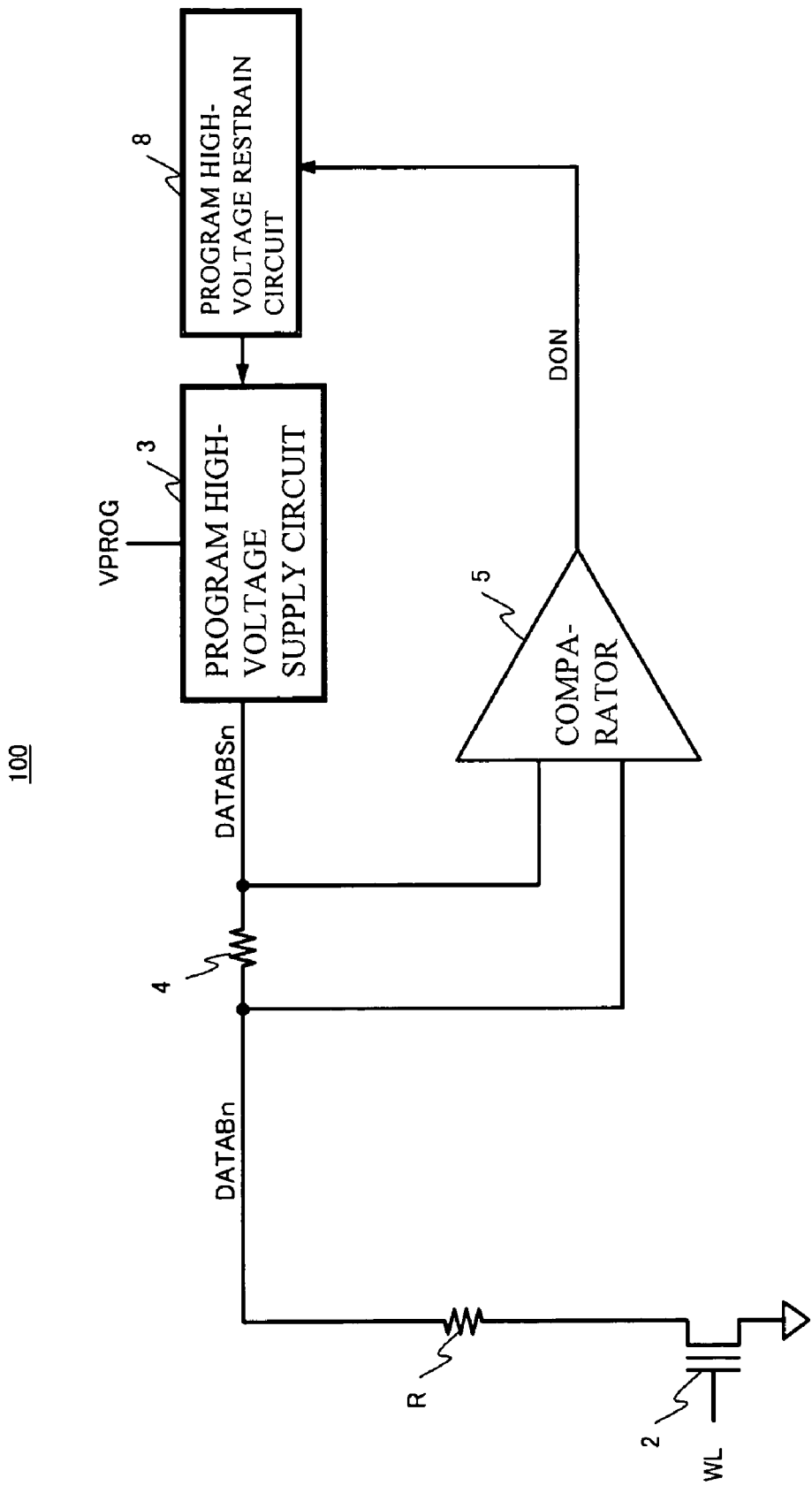
FIG. 5 is a circuit diagram of a circuit involved in programming of a non-volatile semiconductor memory device according to a second embodiment of the present invention.

A second embodiment of the present invention will now be described. FIG. 5 is a circuit diagram of a circuit involved in programming of a non-volatile semiconductor memory device according to the second embodiment of the present invention. Referring to FIG. 5, a non-volatile semiconductor device 100 includes the memory cell 2, the program high-voltage supply circuit 3, the resistive element 4, the comparator circuit 5 and a program high-voltage restrain circuit 8. Like reference numerals refer to like elements. The program high-voltage supply circuit 3 supplies the drain of the memory cell 2 with the high voltage for programming. The resistive element 4 is interposed between the output DATABSn of the program high-voltage supply circuit 3 and the common data bus line DATABn, and senses a current flowing through the resistive element 4 due to the potential difference between the ends of the resistive element 4. The comparator circuit 5 compares the potential difference between the ends of the resistive element 4, and switches a signal DON to HIGH when the voltage developing across the resistive element 4 is smaller than a given constant voltage. The current flowing through the resistive element 4 decreases as the programming progresses. It is thus determined whether the programming is about to be completed by sensing the current flowing through the resistive element 4.

The program high-voltage restrain circuit 8 controls the intensity of supply of the high voltage VPROG for programming when the programming is about to be completed. The circuit 8 controls the drain voltage so as to be lower than that used in the normal programming when the current flowing through the drain node in programming becomes lower than the given constant level. This makes it possible to suppress the drain voltage when the programming is completed or is about to be completed and to prevent the unselected memory cell that shares the drain with the selected memory cell from receiving a drain disturb.

FIG. 6 is a circuit diagram of the detailed configuration of the circuit involved in programming of the non-volatile semiconductor memory device according to the second embodiment of the present invention. Referring to FIG. 6, the non-volatile semiconductor memory device 100 includes the memory cells 21 and 22, the program high-voltage supply circuit 3, the resistive element 4, and the program high-voltage restrain circuit 8. Like reference numerals refer to like elements. The memory 21 is to be programmed, and the memory 22 is unselected. The program high-voltage supply circuit 3 includes the NMOS transistors 31 through 34, PMOS transistors 35 through 37 and the inverter 38. The comparator circuit 5 includes the NMOS transistors 51 through 53, the PMOS transistors 54 and 55, the inverter 56, and the resistors 57 and 58. The program high-voltage restrain circuit 8 includes NMOS transistors 81 through 83, a NAND circuit 84 and inverters 85 through 87.

The program high-voltage restrain circuit 8 generates, from the signal PGMn that switches to HIGH when the memory cell 21 is to be programmed, a signal PGMD and its inverted signal PGMDB, in which the signal PGMD has the rising edge that lags behind the signal PGMn. The signals PGMD and PGMDS are internal control signals.

Figure 7:
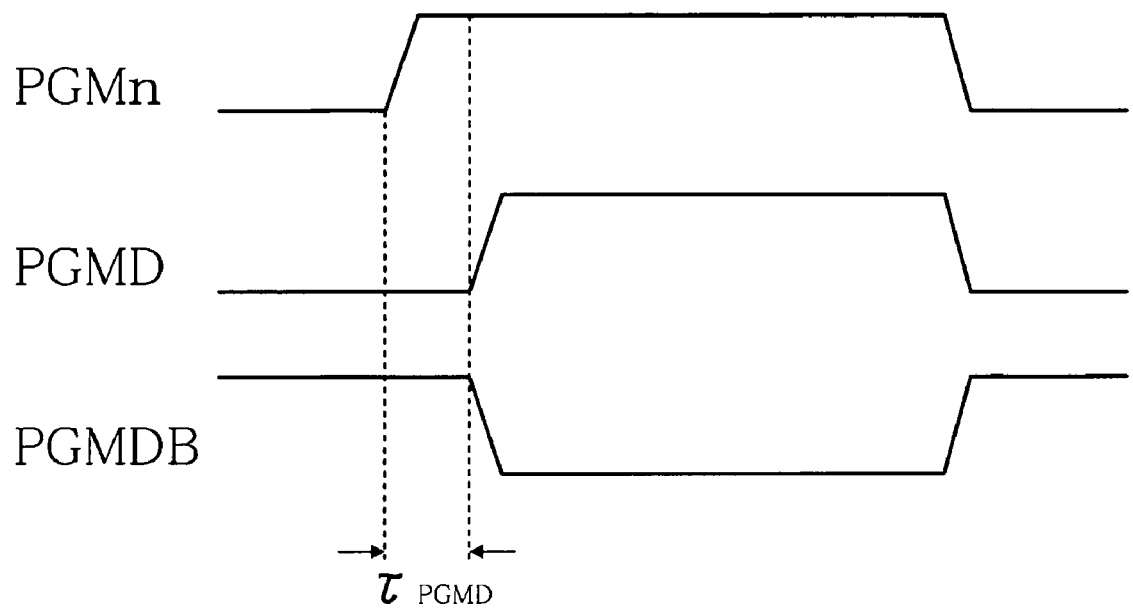
FIG. 7 is a timing chart of clocks used in a program high programming voltage restrain circuit.

FIG. 7 is a timing chart of the internal clocks in the program high-voltage restrain circuit 8. The reason why the rising edge of the signal PGMD lags behind that of the signal PGMn is that a delay takes place until the program high-voltage restrain circuit 8 decodes programming/non-programming. The gate (PG) of the PMOS transistor 37 of the program high-voltage supply circuit 3 is normally LOW, and the high voltage VPROG for programming is strongly supplied to the output of the program high-voltage supply circuit 3. The NAND circuit 84 cuts OFF the NMOS transistor 33 when the signals DON and PGMD are both HIGH.

The NMOS transistors 81 and 82 are connected in series between the node PG and the power supply voltage VCC. The NMOS transistor 81 has a relatively small threshold value VT, and implements a source-follower operation. For example, when the signal DON is equal to the power supply voltage VCC, the node PG is supplied with a voltage that is VT lower than VCC, that is, (VCC−VT).

In programming, the signal PGMn switches to HIGH, and the signal PGMD switches to HIGH. The node PG is connected to the NMOS transistor 81 via the NMOS transistor 82. When programming of the memory cell is about to be completed, the output signal DON of the comparator circuit 5 switches to HIGH. When the threshold value VT of the NMOS transistor 81 is, for example, 0 V, the voltage of the signal DON is applied to the node PG as it is. The potential of the gate of the PMOS transistor 37 is slightly raised from 0 V, which weakens the ability of supplying the program voltage of the program high-voltage supply circuit 3. Thus, during programming, the potential of the output DATABSn of the program high-voltage supply circuit 3 is slightly lower than the high voltage VPROG for programming.

In this manner, the gate PG of the PMOS transistor 37 of the program high-voltage supply circuit 3 is raised up to VCC at maximum, so that the ability of supplying the program voltage of the program high-voltage supply circuit 3 can be weakened. It is thus possible to suppress an increase in the drain voltage when the programming is about to be completed.

The NMOS transistor 83 is added to the level shifter, and the gate of the NMOS transistor 83 is supplied with the signal PGMDG that is LOW during the time when the signal PGMn is HIGH. Thus, even if the NMOS transistor 31 is turned ON due to an increase in the potential of the node PG, the PMOS transistor 36 can be retained in the OFF state. This causes the node PG to be raised to the high voltage VPROG for programming and makes it possible to prevent the PMOS transistor 37 from turning OFF and to prevent the programming from being completed.

The present embodiment puts restrictions on the intensity (ability) of supplying the high voltage for programming generated by the program high-voltage supply circuit and prevents the drain voltage from being raised when the programming is about to be terminated.

Third Embodiment

Figure 8:
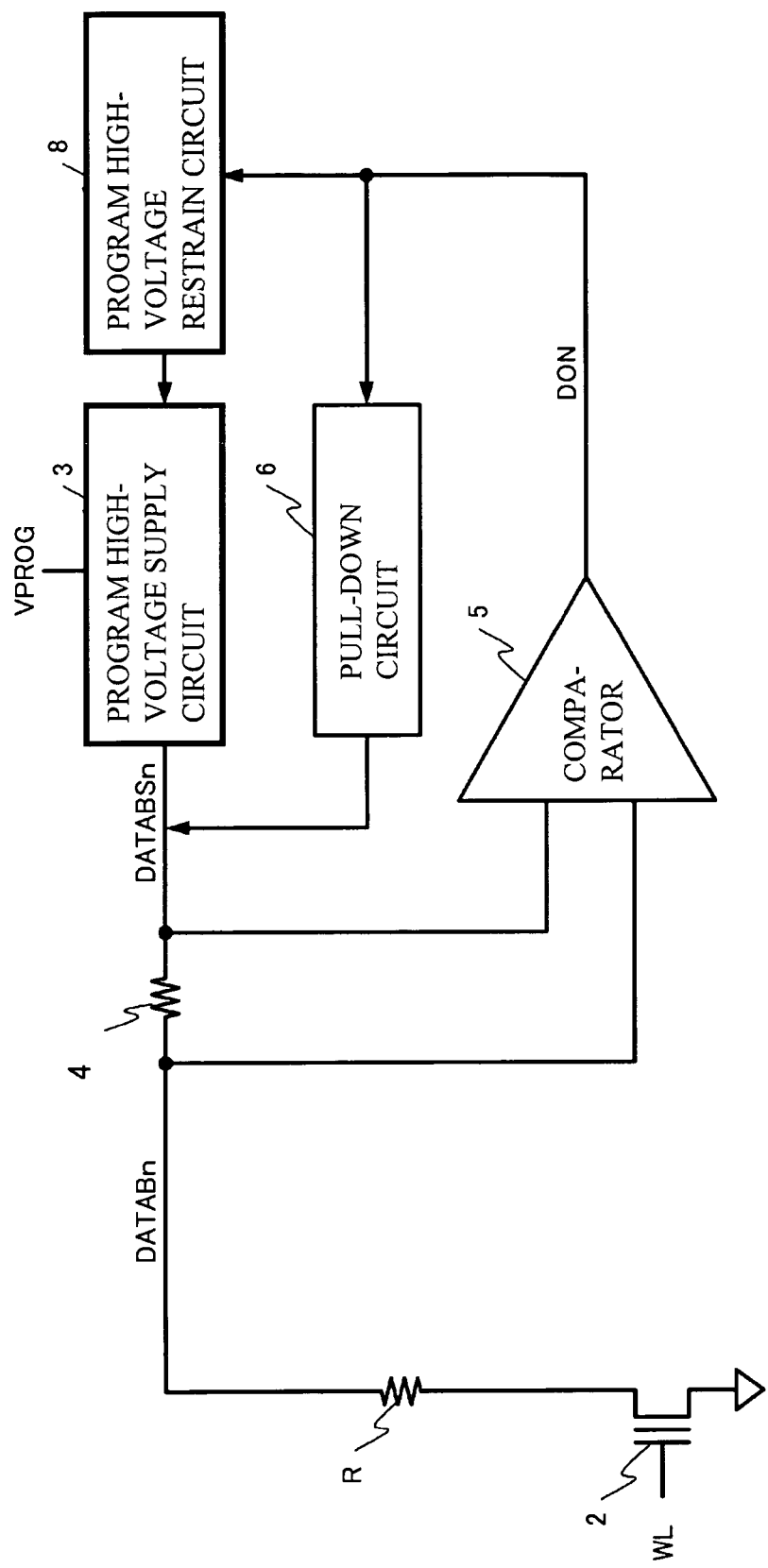
FIG. 8 is a circuit diagram of a circuit involved in programming of a non-volatile semiconductor memory device according to a third embodiment of the present invention.

A third embodiment will now be described. FIG. 8 is a circuit diagram of a circuit involved in programming of a non-volatile semiconductor memory device according to the third embodiment of the present invention. A non-volatile semiconductor memory device includes the memory cell 2, the program high-voltage supply circuit 3, the resistive element 4, the comparator circuit 5, the pull-down circuit 6 and the program high-voltage restrain circuit 8. The program high-voltage supply circuit 3 supplies the drain of the memory cell 2 with the program voltage. The resistive element 4 is interposed between an output DATABSn of the program high-voltage supply circuit 3 and the common data bus line DATABn, and senses a current flowing through the resistive element 4 by the voltage drop developing across it.

The comparator circuit 5 compares the voltage drop across the resistive element with the reference voltage, and switches the signal DON to HIGH when the voltage across the resistive element 4 is lower than the given constant voltage. The current flowing through the resistive element 4 decreases as the programming advances. It is thus determined whether the programming is about to be completed by sensing the current flowing through the resistive element 4.

The pull-down circuit 6 pulls down the potential of the output DATABSn of the program high-voltage supply circuit 3 towards the ground when the programming is about to be completed. The program high-voltage restrain circuit 8 controls the intensity of supply of the high voltage VPROG for programming when the programming is about to be completed. The circuit 8 controls the drain voltage so as to be lower than that used in the normal programming when the current flowing through the drain node in programming becomes lower than the given constant level.

Figure 9:
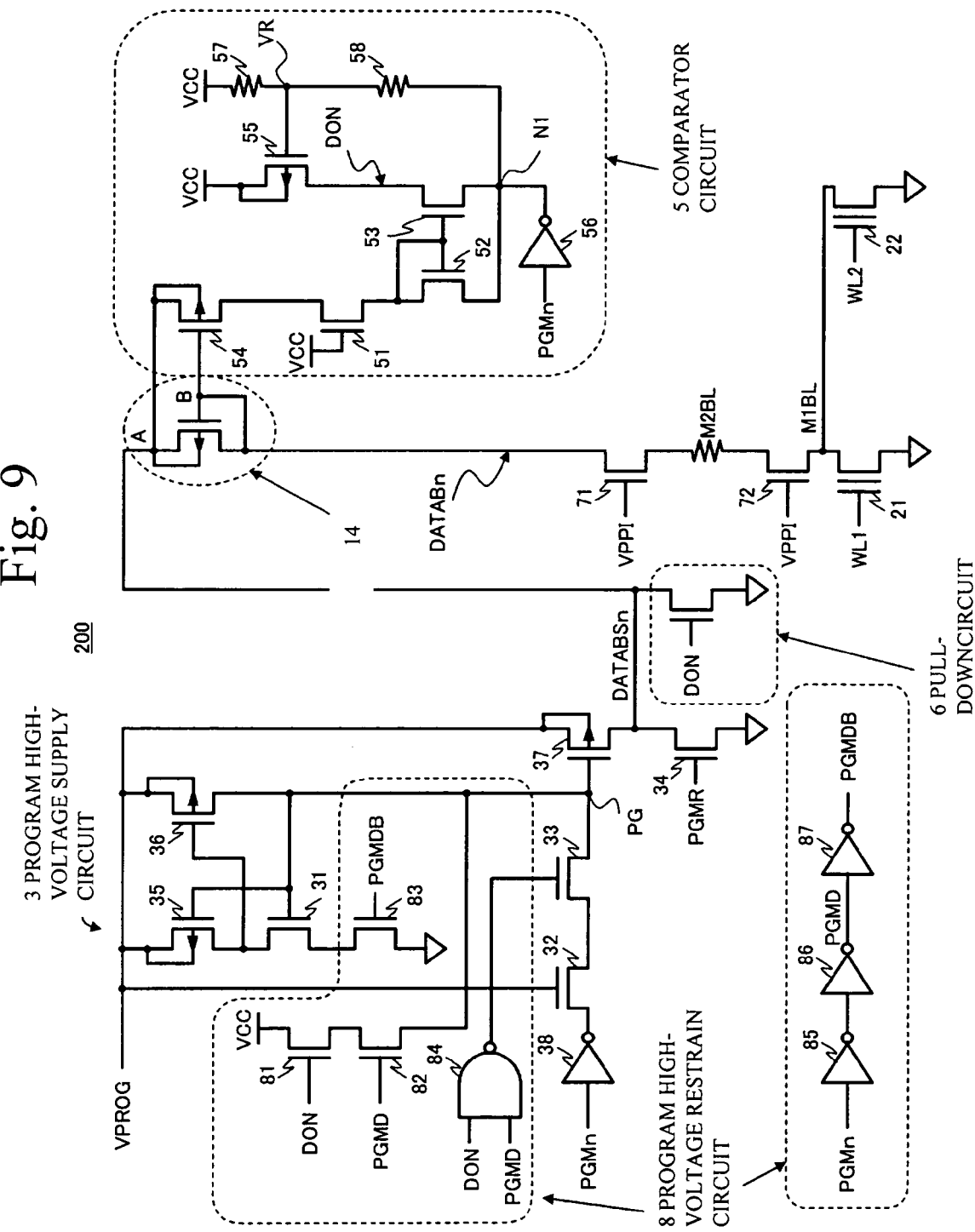
FIG. 9 is a circuit diagram of the detailed configuration of the circuit involved in programming of the non-volatile semiconductor memory device according to the third embodiment of the present invention.

FIG. 9 is a circuit diagram of the detailed configuration of the circuit involved in programming of the non-volatile semiconductor memory device according to the third embodiment of the present invention. Referring to FIG. 9, a non-volatile semiconductor memory device 200 includes the memory cells 21 and 22, the program high-voltage supply circuit 3, the resistive element 4, the comparator circuit 5, the pull-down circuit 6 and the program high-voltage restrain circuit 8. Like reference numerals refer to like elements. The memory cell 21 is to be programmed, and the memory cell 22 is unselected.

The gates of the memory cells 21 and 22 are controlled by a voltage applied to the word line WL. The path transistors 71 and 72 are used to select the associated bit line. The program high-voltage supply circuit 3 includes the NMOS transistors 31 through 34, the PMOS transistors 35 through 37, and the inverter 38. The resistive element 4 is implemented by the PMOS transistor 14 provided between the output DATABSn of the program high-voltage supply circuit 3 and the common data bus line DATABn. The gate and drain of the PMOS 14 transistor are connected. That is, the resistive element 4 is formed by the diode-connected PMOS transistor 14.

The comparator circuit 5 includes the NMOS transistors 51 through 53, the PMOS transistors 54 and 55, the inverter 56, and the resistors 57 and 58. The pull-down circuit 6 is formed by the NMOS transistor. The program high-voltage restrain circuit 8 includes the NMOS transistors 81 through 83, the NAND circuit 84 and the inverters 85 through 87. The pull-down circuit 6 and the program high-voltage restrain circuit 8 effectively reduce the drain voltage when the programming is about to be completed.

Figure 10:
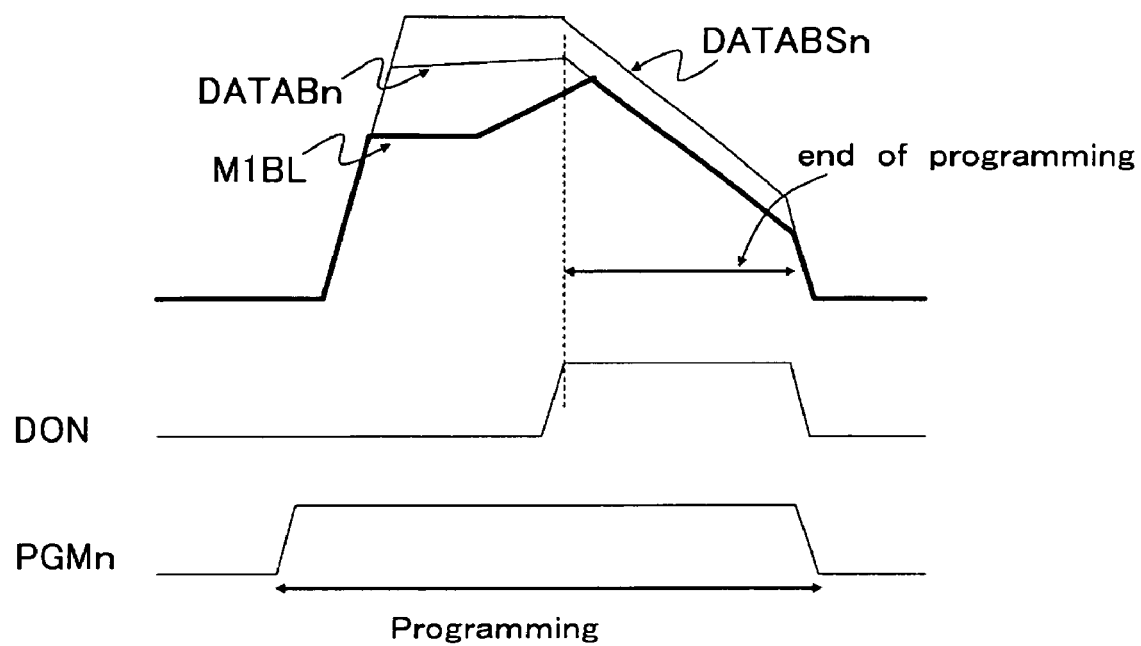
FIG. 10 is a waveform diagram showing a drain voltage used in the non-volatile semiconductor memory device according to the third embodiment of the present invention.

FIG. 10 is a waveform diagram showing a drain voltage used in the non-volatile semiconductor memory device according to the third embodiment of the present invention. Referring to FIG. 10, the signal PGMn switches to HIGH at the time of programming. There is the difference between the potential of the output DATABSn of the program high-voltage supply circuit 3 and the potential of the common data bus line DATABn because of the presence of the resistive element 14. The memory cell 21 is in the erased state, which causes a voltage drop. A slightly low voltage is thus applied to the bit line M1BL. When the programming of the selected memory cell 21 progresses, the smaller current flows through the memory cell 21, and the drain voltage is raised. This is detected by sensing reduction in the current. When the programming is about to be completed, the signal DON switches to HIGH. The pull-down circuit 6 is activated, and the node PG is simultaneously raised by the program high-voltage restrain circuit 8. The potential of the output DATABSn of the program high-voltage supply circuit 3 decreases, and thus the drain voltage DATABn decreases. It is therefore possible to reduce the drain disturb applied to the memory cell 22 that shares the drain with the selected memory cell 21.

The present embodiment draws a potential of the output DATABSn of the program high-voltage supply circuit 3 towards the ground by the pull-down circuit 6, and weakens the ability of the PMOS transistor 37, which pulls up the potential of the output DATABSn of the program high-voltage supply circuit 3. It is therefore possible to effectively suppress the drain voltage when the programming is completed or is about to be completed and to more effectively prevent the unselected memory cell 22 that shares the drain with the selected memory cell 21 from receiving the drain disturb.

Fourth Embodiment

Figure 11:
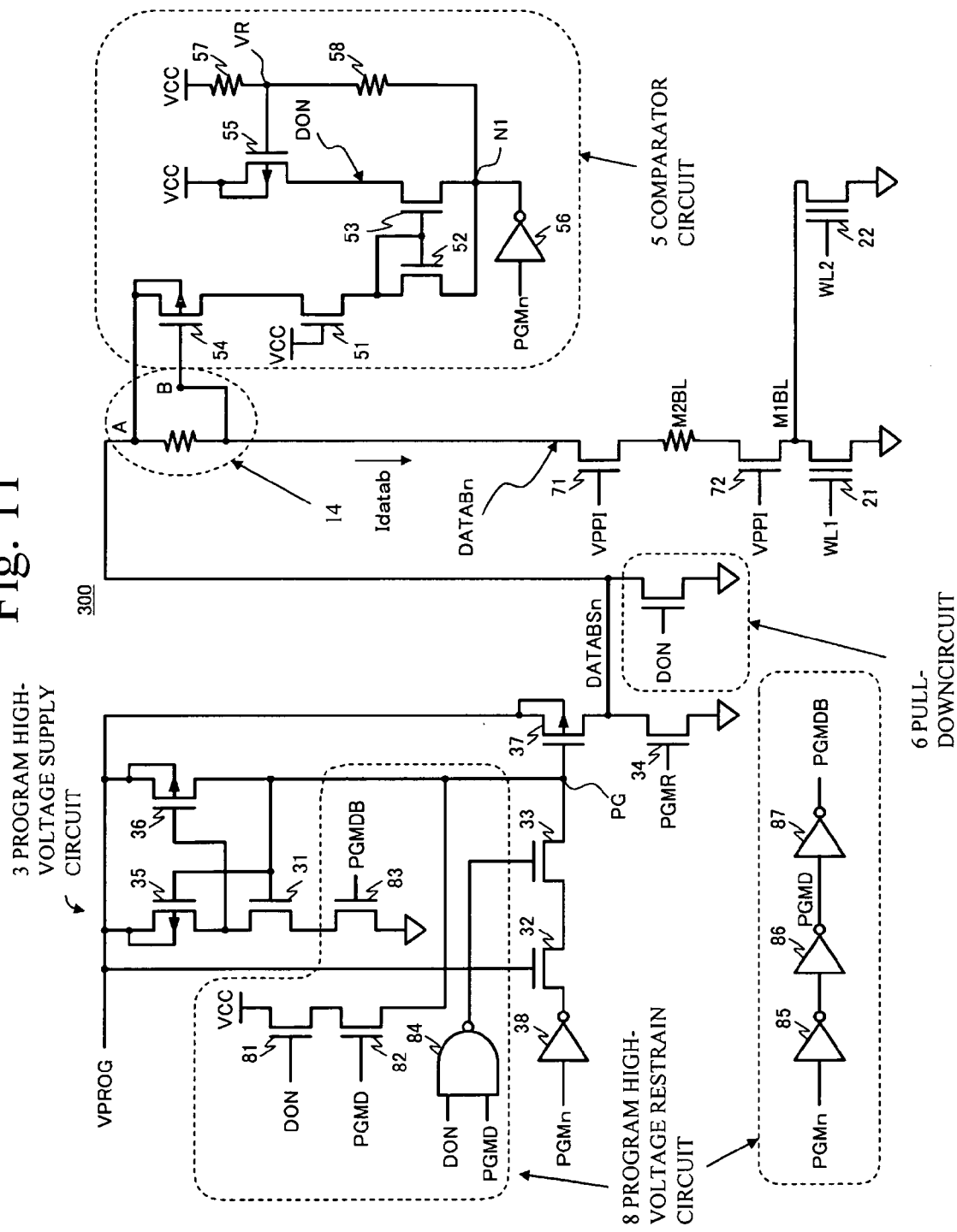
FIG. 11 is a circuit diagram of the detailed configuration of a circuit involved in programming of a non-volatile semiconductor memory device according to a fourth embodiment of the present invention.

A fourth embodiment will now be described. FIG. 11 is a circuit diagram of the detailed configuration of a circuit involved in programming of a non-volatile semiconductor memory device according to a fourth embodiment of the present invention. A non-volatile semiconductor memory device 300 includes the memory cells 21 and 22, the program high-voltage supply circuit 3, the resistive element 14, the comparator circuit 5, the pull-down circuit 6, and the program high-voltage restrain circuit 8. Like reference numerals refer to like elements.

The program high-voltage supply circuit 3 includes the NMOS transistors 31 through 34, the PMOS transistors 35 through 37, and the inverter 38. The resistive element 14 is a polysilicon resistor connected between the output DATABSn of the 35 program high-voltage supply circuit 3 and the common data bus line DATABn. The comparator 5 includes the NMOS transistors 51 through 53, the PMOS transistors 54 and 55, the inverter 56 and resistors 57 and 58. The pull-down circuit 6 is implemented by the NMOS transistor. The program high-voltage restrain circuit 8 includes the NMOS transistors 81 through 83, the NAND circuit 84 and the inverters 85 through 87. The operation of the present embodiment is similar to the aforementioned operation, and a description thereof will now be omitted. As described above, the resistive element 14 may be implemented by the polysilicon resistor.

According to the present invention, when the program current Idatab that flows through the drain node in programming becomes lower than a given constant level, the drain voltage is controlled to be lower than the level used in normal programming. This makes it possible to suppress the drain voltage when the programming is completed or is about to be completed and to prevent the unselected memory cell that shares the drain of the selected memory cell from receiving the drain disturb.

The control of the drain voltage is implemented by the pull-down circuit 6 and the program high-voltage restrain circuit 8. The pull-down circuit connects a dummy current source to the drain. The program high-voltage restrain circuit 8 regulates the driving capability of the PMOS transistor 37 that is the driver of the drain power source.

Each of the program high-voltage supply circuit may be equipped with the above-mentioned circuit of the present invention. This makes it possible to determine, on the bit bases, whether the programming is about to be completed. When the pull-down circuit is used, the transistor size may be designed so as to flow the cell current as large as the current that flows at the commencement of programming. This makes it possible to stabilize the program voltage regardless of the state of each bit.

The above-mentioned non-volatile semiconductor memory device may be a flash memory or the like or may be included, as a part, in a semiconductor device. The non-volatile semiconductor memory device may be of NOR type, AND type or a virtual ground type such as MirrorBit®. The program high-voltage supply circuit corresponds to a program voltage supply circuit as claimed, and the program high-voltage restrain circuit corresponds to a program voltage restrain circuit as claimed.

Although the foregoing is directed to some preferred embodiments, the present invention is not limited thereto but includes various variations and modifications within the scope of the claimed invention.

What is claimed is:

1. A semiconductor device comprising:
    a program voltage supply circuit that supplies a drain of a memory cell with a program voltage; and
    a pull-down circuit that pulls down a potential of an output of the program voltage supply circuit in accordance with a current that flows in a data bus line connected to the memory cell, further comprising a program voltage restrain circuit that restrains an intensity of supply of the program voltage by the program voltage supply circuit.

2. The semiconductor device claimed in claim 1, further comprising:
    a resistive element interposed between the output of the program voltage supply circuit and the data bus line; and
    a comparator circuit that determines that a potential difference across the resistive element becomes lower than a reference voltage.

3. The semiconductor device as claimed in claim 1, wherein the program voltage supply circuit comprises a transistor that outputs the program voltage.

4. The semiconductor device as claimed in claim 1, further comprising:
    a resistive element interposed between the output of the program voltage supply circuit and the data bus line; and
    a comparator circuit that determines that a potential difference across the resistive element becomes lower than a reference voltage,
    the pull-down circuit being controlled by an output signal of the comparator circuit.

5. The semiconductor device as claimed in claim 1, further comprising:
    a resistive element interposed between the output of the program voltage supply circuit and the data bus line; and
    a comparator circuit that determines that a potential difference across the resistive element becomes lower than a reference voltage,
    the program voltage restrain circuit being controlled by an output signal of the comparator circuit.

6. The semiconductor device as claimed in claim 3, wherein the transistor of the program voltage supply circuit has a gate controlled by an output signal of the comparator circuit.

7. The semiconductor device as claimed in claim 2, wherein the resistive element comprises a transistor.

8. The semiconductor device as claimed in claim 2, wherein the resistive element comprises a resistor of polysilicon.

9. The semiconductor device as claimed in claim 1, wherein the pull-down circuit comprises a transistor connected between the output of the program voltage supply circuit and ground.

10. The semiconductor device as claimed in claim 1, wherein the memory cell is a non-volatile memory having a charge storage layer.

* * * * *